US010580778B2

(12) United States Patent
Chuang et al.

(10) Patent No.: US 10,580,778 B2
(45) Date of Patent: Mar. 3, 2020

(54) DYNAMIC RANDOM ACCESS MEMORY STRUCTURE AND METHOD FOR PREPARING THE SAME

(71) Applicant: NANYA TECHNOLOGY CORPORATION, New Taipei (TW)

(72) Inventors: Da-Zen Chuang, Taipei (TW); Chih-Chung Sun, Zhubei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 16/038,709

(22) Filed: Jul. 18, 2018

(65) Prior Publication Data
US 2020/0027884 A1 Jan. 23, 2020

(51) Int. Cl.
| H01L 27/108 | (2006.01) |
| G11C 13/02 | (2006.01) |
| G11C 11/401 | (2006.01) |
| B82Y 40/00 | (2011.01) |
| B82Y 30/00 | (2011.01) |

(52) U.S. Cl.
CPC ...... *H01L 27/10855* (2013.01); *G11C 11/401* (2013.01); *G11C 13/025* (2013.01); *H01L 27/108* (2013.01); *H01L 27/10805* (2013.01); *H01L 27/10885* (2013.01); *B82Y 30/00* (2013.01); *B82Y 40/00* (2013.01)

(58) Field of Classification Search
CPC ............... H01L 27/10805; H01L 27/10855
USPC ............................................ 257/296, 68, 71
See application file for complete search history.

(56) References Cited

U.S. PATENT DOCUMENTS

| 2004/0262637 A1* | 12/2004 | Reisinger | B82Y 10/00 257/200 |
| 2006/0157771 A1* | 7/2006 | Choi | B82Y 10/00 257/306 |
| 2008/0003768 A1* | 1/2008 | Oh | B82Y 10/00 438/399 |
| 2015/0171159 A1* | 6/2015 | Lim | H01L 27/10814 257/532 |

* cited by examiner

*Primary Examiner* — David Vu
*Assistant Examiner* — Brandon C Fox
(74) *Attorney, Agent, or Firm* — Muncy, Geissler, Olds & Lowe, P.C.

(57) ABSTRACT

The present disclosure provides a DRAM cell structure. The DRAM cell structure includes a substrate, a gate structure disposed in the substrate, a source region and a drain region disposed in the substrate respectively at two sides of the gate structure, a landing pad disposed over the drain region, a plurality of carbon nanotubes disposed on the landing pad, a top electrode disposed over the plurality of carbon nanotubes, and a dielectric layer disposed between the top electrode and the plurality of carbon nanotubes.

15 Claims, 16 Drawing Sheets

DYNAMIC RANDOM ACCESS MEMORY STRUCTURE AND METHOD FOR PREPARING THE SAME

TECHNICAL FIELD

The present disclosure relates to a dynamic random access memory (DRAM) structure and a method for preparing the same, and more particularly, to a capacitor in a DRAM cell structure and a method for preparing the same.

DISCUSSION OF THE BACKGROUND

A DRAM cell structure typically includes a metal-oxide-semiconductor field effect transistor (MOSFET) device and a capacitor that are built in or on a semiconductor silicon substrate. The MOSFET device and the capacitor form a series connection with each other. Using a word line and a bit line, a DRAM cell structure can be read and programmed.

There is a continuing trend of increasing the storage density of integrated circuit memories to provide increased quantities of data storage on a single chip. To address the challenges of reduced structure sizes, DRAM designs have been proposed which incorporate capacitors having vertical extensions above the surface of the substrate ("stacked" capacitors) or below the surface of the substrate ("trenched" capacitors). By adopting a more three-dimensional structure, such DRAM designs provide memory capacitors having larger capacitance while occupying less surface area of the substrate.

However, when the critical dimension of a DRAM cell structure is reduced to sub-20 nm scale, the occupied area is too small to allow formation of a capacitor with a very tall, vertical cylinder shape using current photolithography and etching processes. Therefore, there is a need for providing a method of preparing a capacitor having high capacitance in a DRAM cell structure.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a DRAM cell structure. The DRAM cell structure includes a substrate, a gate structure disposed in the substrate, a source region and a drain region disposed in the substrate respectively at two sides of the gate structure, a landing pad disposed over the drain region, a plurality of carbon nanotubes disposed on the landing pad, a top electrode disposed over the plurality of carbon nanotubes, and a dielectric layer disposed between the top electrode and the plurality of carbon nanotubes.

In some embodiments, the DRAM cell structure further includes a dielectric structure disposed on the substrate.

In some embodiments, the DRAM cell structure further includes a contact plug disposed in the dielectric structure. In some embodiments, the contact plug electrically connects the drain region and the landing pad.

In some embodiments, the DRAM cell structure further includes a bit line structure disposed on the source region. In some embodiments, the dielectric structure covers the bit line structure.

In some embodiments, an extending direction of the plurality of carbon nanotubes is perpendicular to a surface of the substrate.

In some embodiments, the plurality of carbon nanotubes have different diameters.

Another aspect of the present disclosure provides a method for preparing a DRAM cell structure. The method includes the following steps. A substrate is provided. The substrate includes at least an active region, at least a gate structure disposed in the active region, and a source region and a drain region disposed in the active region at two sides of the gate structure. A conductive layer is formed over the substrate. A plurality of carbon nanotubes are formed on the conductive layer. The conductive layer is patterned. A dielectric layer is conformally formed to cover the plurality of carbon nanotubes and the conductive layer.

In some embodiments, the patterning of the conductive layer is performed before the forming of the plurality of carbon nanotubes.

In some embodiments, the dielectric layer covers a top surface and sidewalls of each of the plurality of carbon nanotubes, portions of a top surface of the conductive layer, and sidewalls of the conductive layer.

In some embodiments, the patterning of the conductive layer is performed after the forming of the plurality of carbon nanotubes.

In some embodiments, the patterning of the conductive layer further includes a step of removing several of the plurality of carbon nanotubes.

In some embodiments, the patterning of the conductive layer is performed before the forming of the dielectric layer.

In some embodiments, the dielectric layer covers a top surface and sidewalls of each of the plurality of carbon nanotubes, portions of a top surface of the conductive layer, and sidewalls of the conductive layer.

In some embodiments, the method further includes a step of forming an electrode on the dielectric layer.

In some embodiments, the method further includes a step of forming a dielectric structure over the substrate.

In some embodiments, the method further includes a step of forming a contact plug in the dielectric structure. In some embodiments, the contact plug electrically connects the drain region and the conductive layer.

In some embodiments, the method further includes a step of forming a bit line structure on the source region before the forming of the dielectric structure.

In some embodiments, an extending direction of the plurality of carbon nanotubes is perpendicular to a surface of the substrate.

In the present disclosure, each carbon nanotube has a diameter in nanometer scale, and it is therefore easy to form the plurality of carbon nanotubes on the landing pad, even when a width or a length of the landing pad is less than 10 nm. Further, the carbon nanotube has a larger length-to-diameter ratio, which can be up to 132,000,000:1, and superior stiffness and strength even with such large length-to-diameter ratio. Therefore, each of the plurality of carbon nanotubes, which serve as a bottom electrode of a capacitor in a DRAM cell structure, has a very large surface area. Accordingly, capacitance of the capacitor is high. In addition, during the forming of the bottom electrode, the plurality of carbon nanotubes can be grown vertically and can be separated from each other without extra photolithography and etching processes, simplifying the manufacturing process, and improving both yield and reliability of the manufacturing process.

In contrast, with a comparative method applied without forming the plurality of carbon nanotubes, photolithography and etching processes are required to form at least one bottom electrode over the drain region. It is difficult to form such bottom electrode with a length-to-diameter ratio as large as that of the present disclosure, and thus formation of a thick conductive layer may be required, and followed by the photolithography and etching processes described above. Such processes are complicated. Further, it is observed that a bottom electrode, even one with a length-to-diameter ratio less than that of the carbon nanotubes, may collapse. Accordingly, the conventional processes for forming DRAM cell structure are not only complicated, but also provide reduced yield and reliability.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Figure 1:
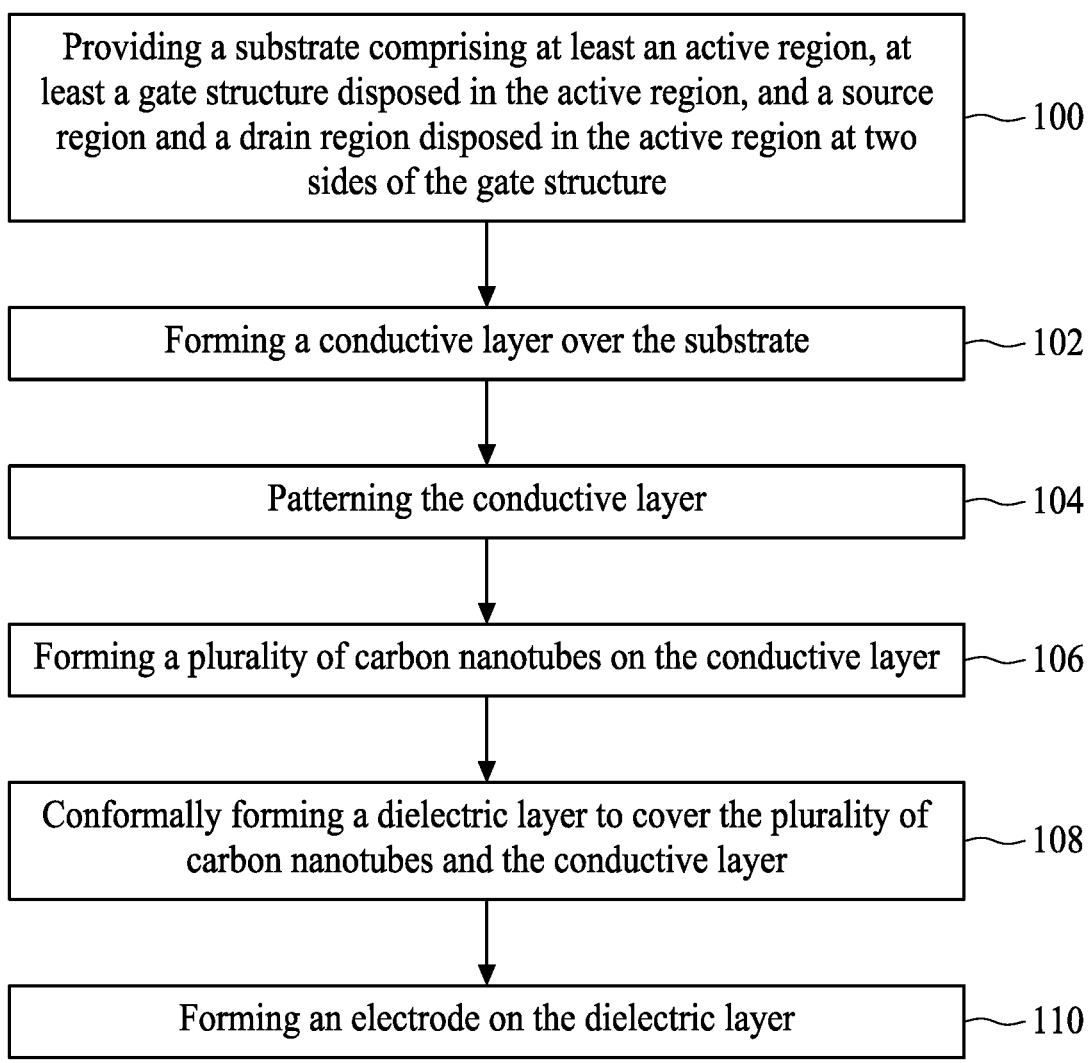
FIG. 1 is a flow diagram illustrating a method for preparing a DRAM cell structure, in accordance with a first embodiment of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As used herein, the terms "patterning" or "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etch or other removal process. The mask can be a photoresist or a hard mask. In some embodiments, a patterning process is adopted to form a patterned layer directly on a surface. The patterning process includes forming a photosensitive film on the surface, conducting a photolithography process, and performing a developing process. The remaining photosensitive film is retained and integrated into the semiconductor device.

Carbon nanotubes mentioned herein are similar to carbon nanofibers in shape and diameter. In some embodiments, the nanotubes can be replaced with the nanofibers, which are carbon composites in a non-hollow, fibrous form having a diameter of up to a few hundred nanometers, whereas carbon nanotubes are in the form of hollow tubes as indicated by their name. Activated carbon fibers can be prepared by spinning to create fibers in a few micrometers in diameter and a few hundred meters in length, whereas carbon nanofibers, which are catalytically synthesized like carbon nanotubes, have a diameter of up to a few hundred nanometers and a length of up to a few tens of micrometers. Carbon nanofibers can be formed using a method similar to the synthetic methods used to form carbon nanotubes.

FIG. 1 is a flow diagram illustrating a method for preparing a DRAM cell structure in accordance with a first embodiment of the present disclosure. The method for preparing the DRAM cell structure 10 includes a step 100, providing a substrate. The substrate can include at least an active region, at least a gate structure disposed in the active region, and a source region and a drain region disposed in the active region at two sides of the gate structure. The method for preparing the DRAM cell structure 10 further includes a step 102, forming a conductive layer over the substrate. The method for preparing the DRAM cell structure 10 further includes a step 104, patterning the conductive layer. The method for preparing the DRAM cell structure 10 further includes a step 106, forming a plurality of carbon nanotubes on the conductive layer. The method for preparing the DRAM cell structure 10 further includes a step 108, conformally forming a dielectric layer to cover the plurality of carbon nanotubes and the conductive layer. The method for preparing the DRAM cell structure 10 further includes a step 110, forming an electrode on the dielectric layer. The method for preparing the DRAM cell structure 10 will be further described according to one or more embodiments.

Figure 2:
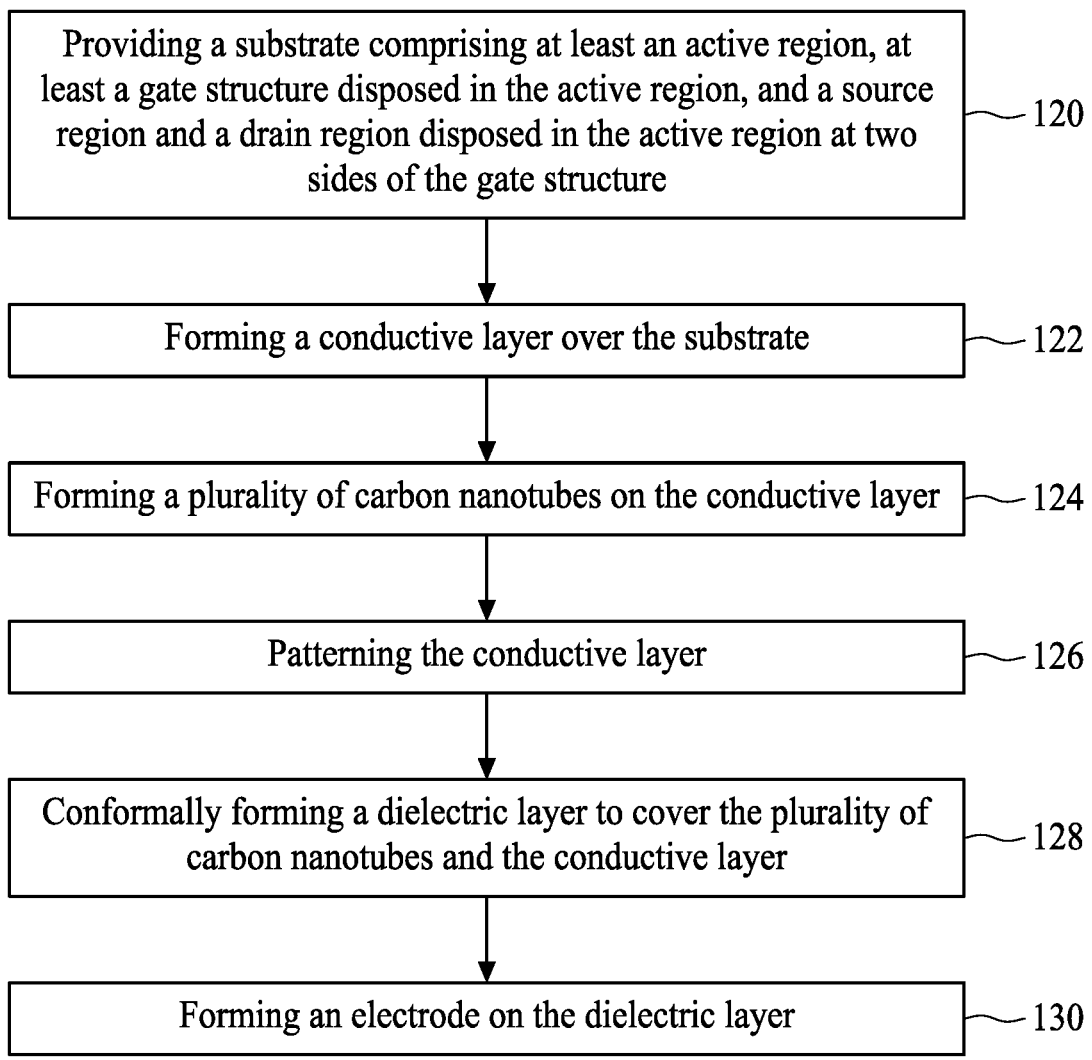
FIG. 2 is a flow diagram illustrating a method for preparing a DRAM cell structure, in accordance with a second embodiment of the present disclosure.

FIG. 2 is a flow diagram illustrating a method for preparing a DRAM cell structure in accordance with a second embodiment of the present disclosure. The method for preparing the DRAM cell structure 12 includes a step 120, providing a substrate. The substrate can include at least an active region, at least a gate structure disposed in the active region, and a source region and a drain region disposed in the active region at two sides of the gate structure. The method for preparing the DRAM cell structure 12 further includes a step 122, forming a conductive layer over the substrate. The method for preparing the DRAM cell structure 12 further includes a step 124, forming a plurality of carbon nanotubes on the conductive layer. The method for preparing the DRAM cell structure 12 further includes a step 126, patterning the conductive layer. The method for preparing the DRAM cell structure 12 further includes a step 128, conformally forming a dielectric layer to cover the plurality of carbon nanotubes and the conductive layer. The method for preparing the DRAM cell structure 12 further includes a step 130, forming an electrode on the dielectric layer. The method for preparing the DRAM cell structure 12 will be further described according to one or more embodiments.

Figure 3A:
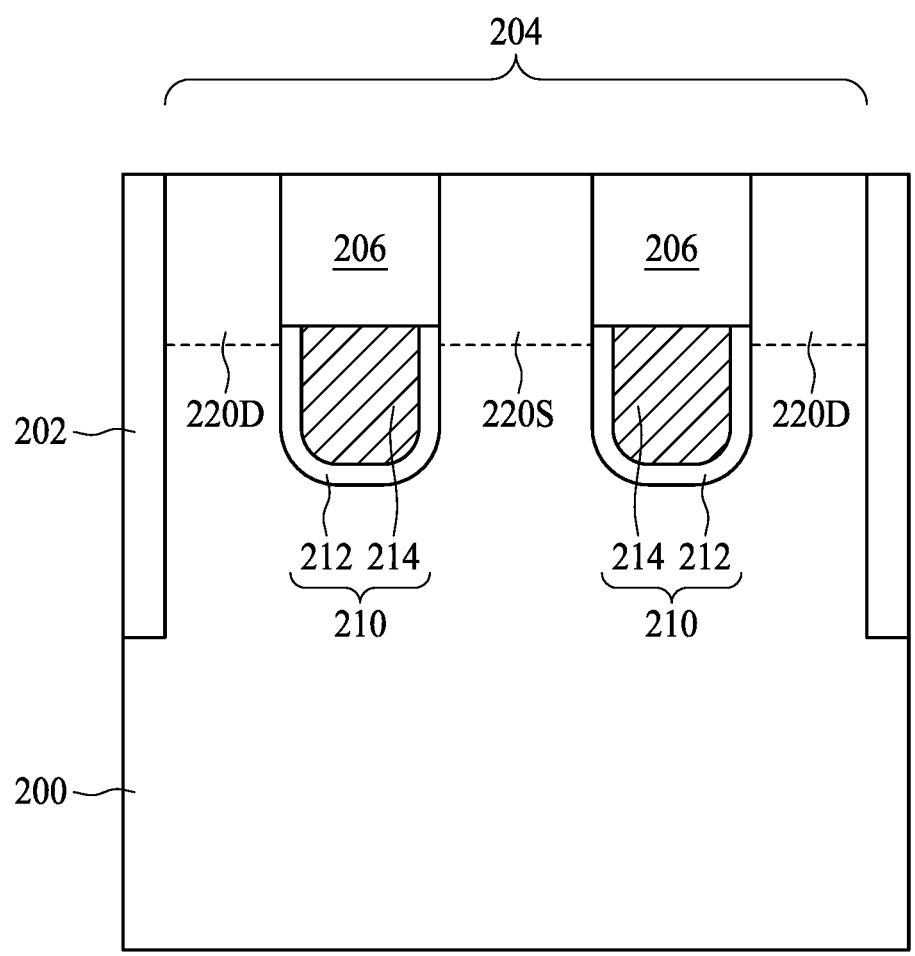
FIGS. 3A to 3G are schematic diagrams illustrating various fabrication stages of the method for preparing the DRAM cell structure in accordance with the first embodiment of the present disclosure.

FIGS. 3A to 3G are schematic diagrams illustrating various fabrication stages constructed according to the method for preparing the DRAM cell structure in accordance with the first embodiment of the present disclosure. Referring to FIG. 3A, a substrate 200 is provided according to step 100 of the method 10. The substrate 200 can include silicon (Si), gallium (Ga), gallium arsenide (GaAs), gallium nitride (GaN), strained silicon, silicon-germanium (SiGe), silicon carbide (SiC), diamond, epitaxy layer or a combination thereof, but the disclosure is not limited thereto. A well region (not shown) may be formed in the substrate 200. The well region may be neutral, or may be an n-type or p-type doped region, depending on the conductivity type of the transistor structure formed thereafter. An isolation structure 202, such as a shallow trench isolation (hereinafter abbreviated as STI) structure, is formed in the substrate 200 for defining at least an active region 204.

Still referring to FIG. 3A, at least a gate structure 210 is subsequently disposed in the substrate 200 in the active region 204. In some embodiments, the gate structure 210 can be a buried gate structure, but the disclosure is not limited thereto. In some embodiments, two buried gate structures 210 can be formed in one active region 204, as shown in FIG. 3A, but the disclosure is not limited thereto. According to the embodiments, at least one trench (not shown) is formed in the substrate 200 by proper etchants. Next, a dielectric layer 212 covering sidewalls and a bottom of the trench is conformally formed in the trench. In some embodiments, the dielectric layer 212 can include dielectric material having high dielectric constant (high-k). For example, the dielectric layer 212 can include SiO, silicon nitride (SiN), silicon oxynitride (SiON), metal oxide such as hafnium oxide (HfO), or other suitable material chosen for compatibility, but the disclosure is not limited thereto. A conductive layer 214 is formed on the dielectric layer 212 and recessed such that a top surface of the conductive layer 214 is lower than an opening of the trench. In some embodiments, the conductive layer 214 can include polysilicon or other suitable material such as metal materials with proper work function, but the disclosure is not limited thereto. Next, an isolation structure 206 is formed to fill the trench, and a planarization process can be performed. Thus, a top surface of the active region 204 can be exposed, as shown in FIG. 3A. Consequently, the buried gate structure 210, which serves as a buried word line for a DRAM device, is obtained. As shown in FIG. 3A, a top surface of the buried gate structure 210 is lower than a surface of the substrate 200 or lower than a top surface of the isolation structure 202.

Next, a source region 220S and a drain region 220D are formed in the active region 204 at two opposite sides of the gate structure 210. The source/drain region 220S/220D includes an n-type or a p-type doped region, depending on the conductivity type of the transistor structure to be formed. In some embodiments, the source region 220S can be formed between the pair of buried gate structures 210, as shown in FIG. 3A. That is, the two buried gate structures 210 share one source region 220S. Accordingly, each buried gate structure 210 and the source/drain region 220S/220D adjacent thereto may constitute a MOSFET device, which serves as a cell selection element. Further, because the buried gate structure 210 may have a three-dimensional structure, a channel length of the channel region may be increased, and a short-channel effect may be reduced.

Figure 3B:
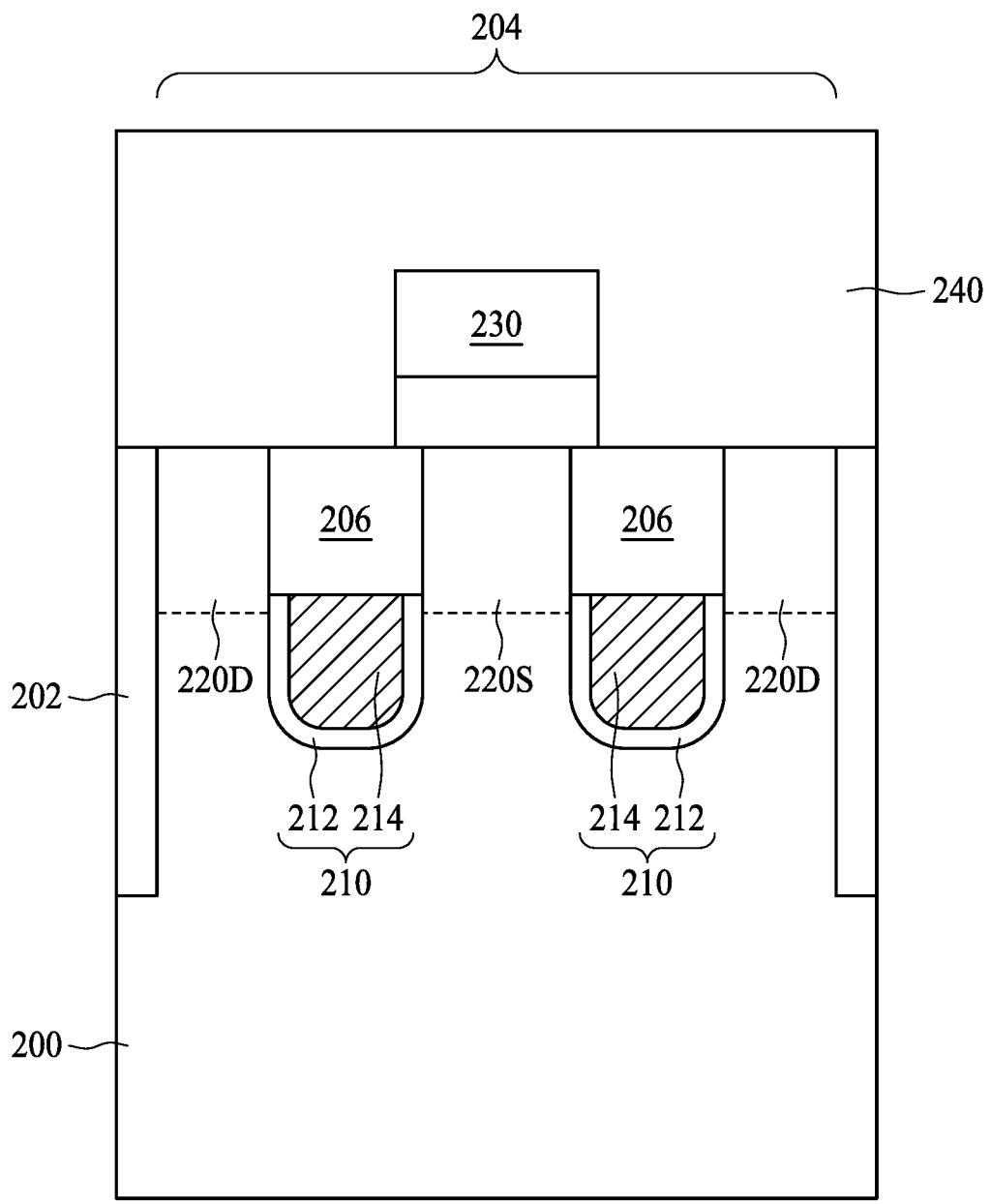

Referring to FIG. 3B, a bit line structure 230 is formed on the source region 220S. In some embodiments, a contact plug (not shown) can be formed between the bit line structure 230 and the source region 220S. After the forming of the bit line structure 230, a dielectric structure 240 is formed on the substrate 200. As shown in FIG. 3B, the dielectric structure 240 covers the bit line structure 230 and the substrate 200. In some embodiments, the dielectric structure 240 can be a single-layered structure. In other embodiments, the dielectric structure 240 can be a multi-layered structure.

Figure 3C:
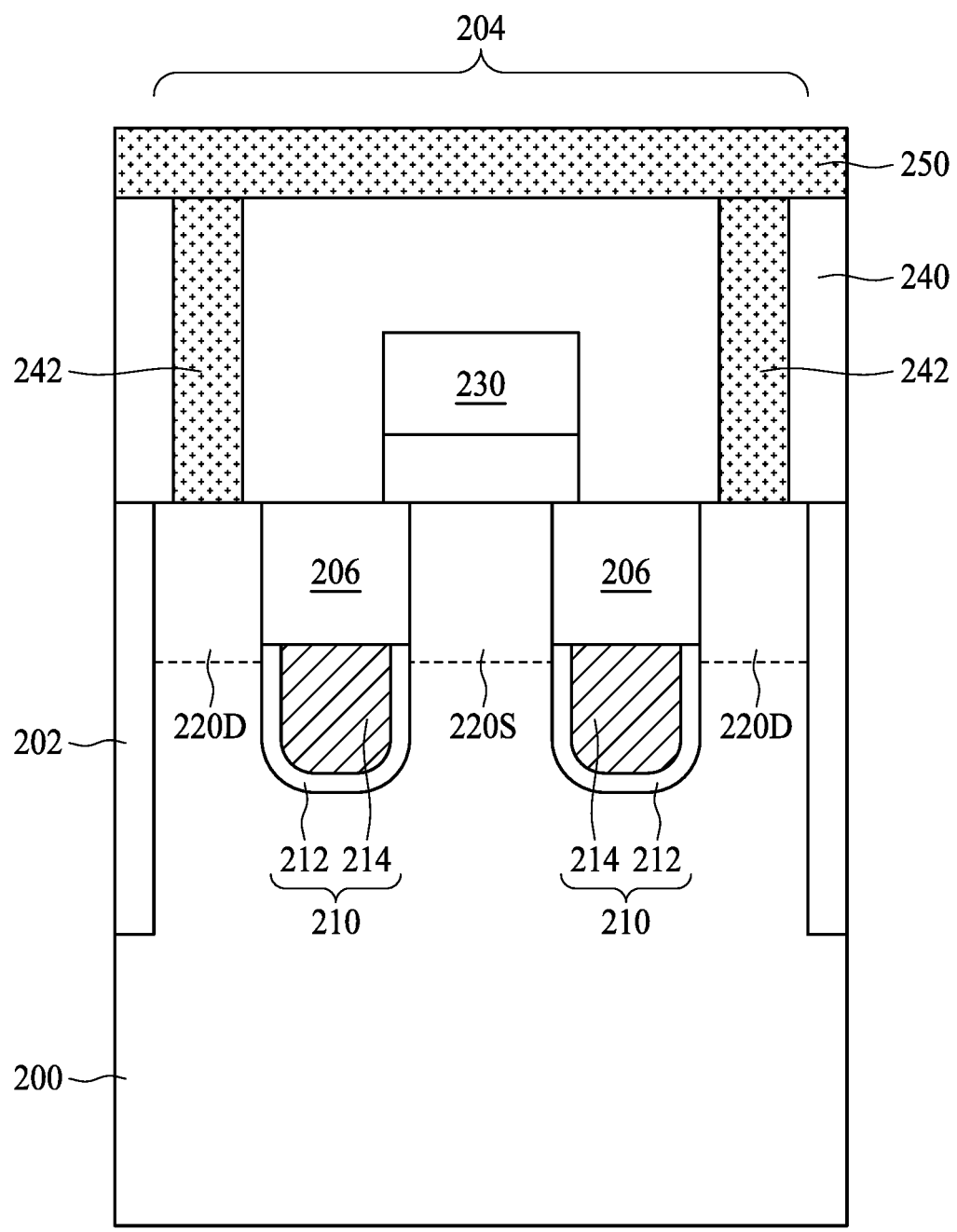

Referring to FIG. 3C, a contact plug 242 is formed in the dielectric structure 240. Further, the contact plug 242 is formed on the drain region 220D for each MOSFET device. After the forming of the contact plugs 242, a conductive layer 250 is formed over the substrate 200 according to step 102 of the method 10. As shown in FIG. 3C, the conductive layer 250 is formed to completely cover the dielectric structure 240 and the contact plugs 242. Further, the conductive layer 250 is in contact with the contact plugs 242. The conductive layer 250 can include doped polysilicon, tungsten, tungsten silicide, aluminum, titanium, titanium nitride, cobalt, but the disclosure is not limited thereto.

Figure 3D:
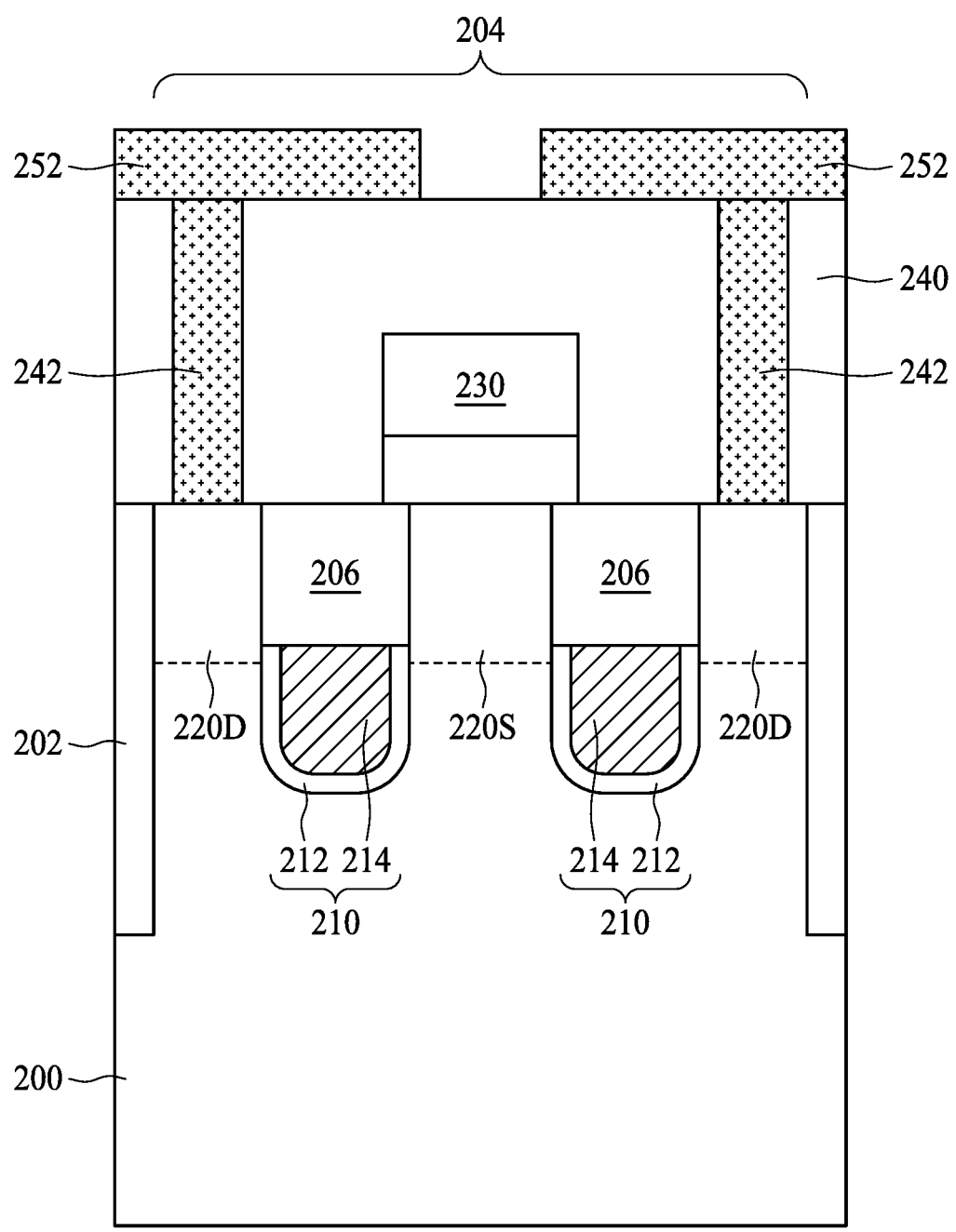

Referring to FIG. 3D, the conductive layer 250 is patterned according to step 104 of the method 10. The conductive layer 250 is patterned to form a landing pad 252 directly on each of the contact plugs 242, as shown in FIG. 3D. However, the landing pads 252 are physically and electrically insulated from each other.

Figure 3E:
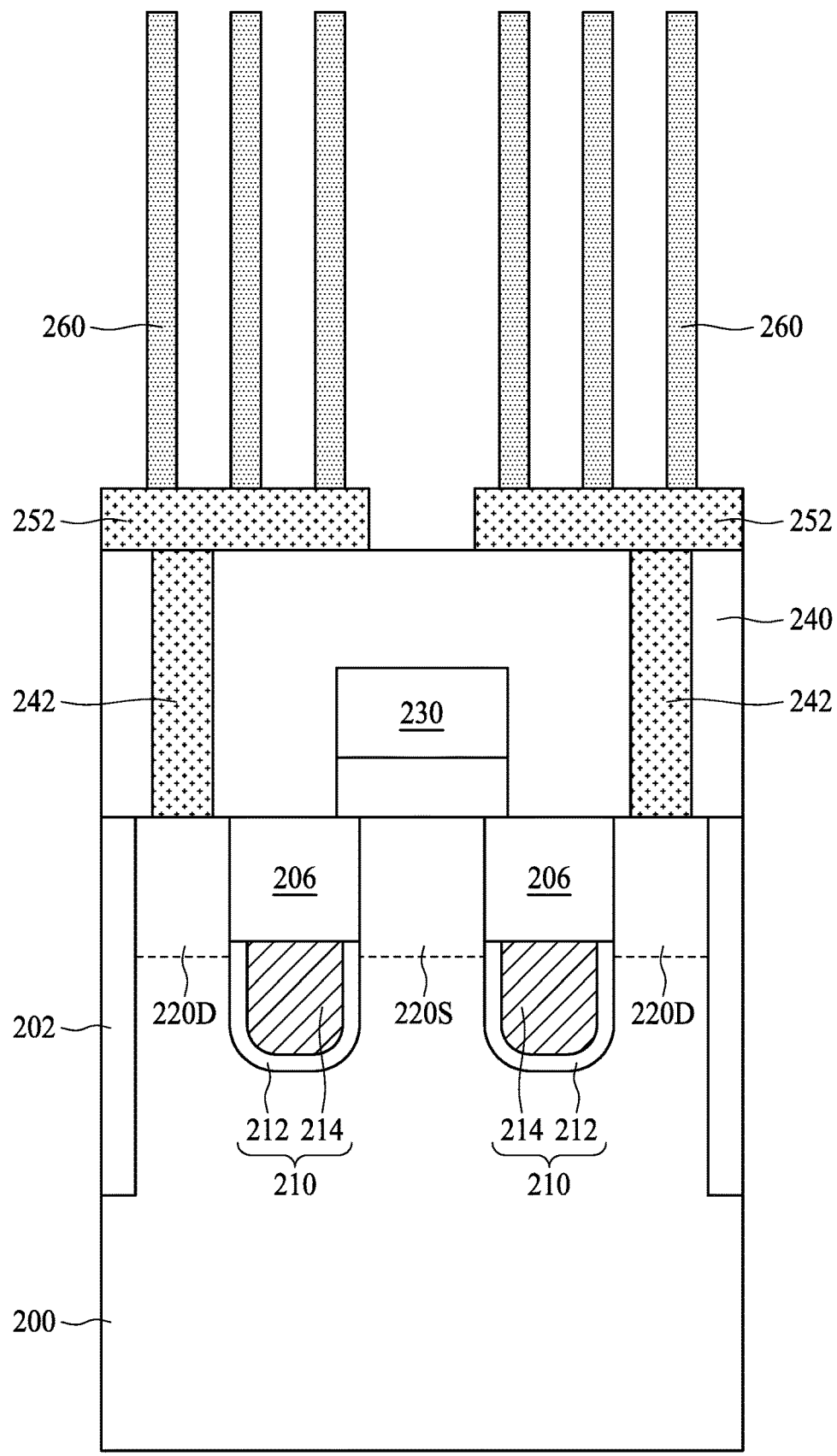
Figure 5:
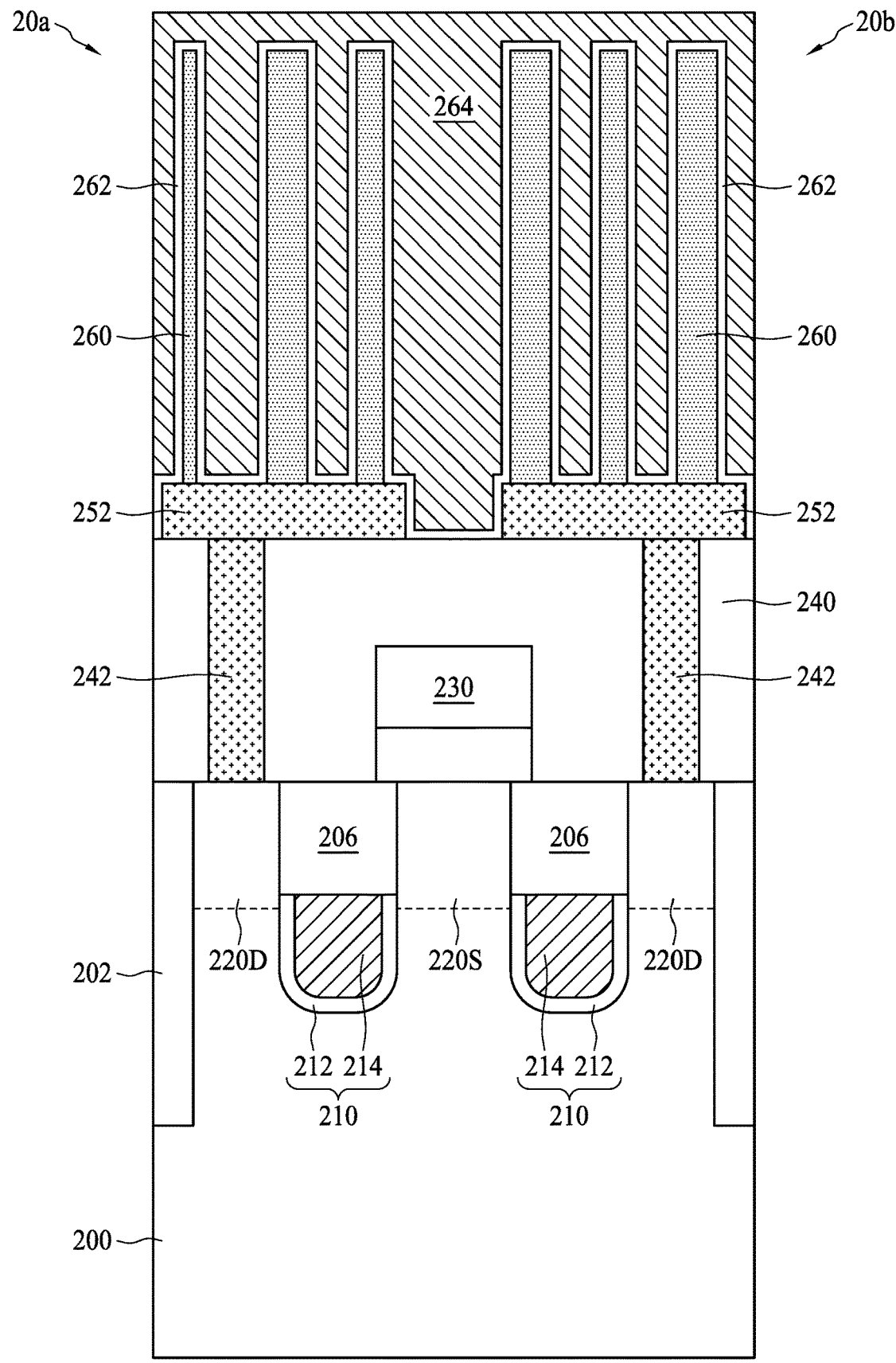
FIG. 5 is a schematic diagram illustrating a DRAM cell structure in accordance with some embodiments of the present disclosure.
Figure 6:
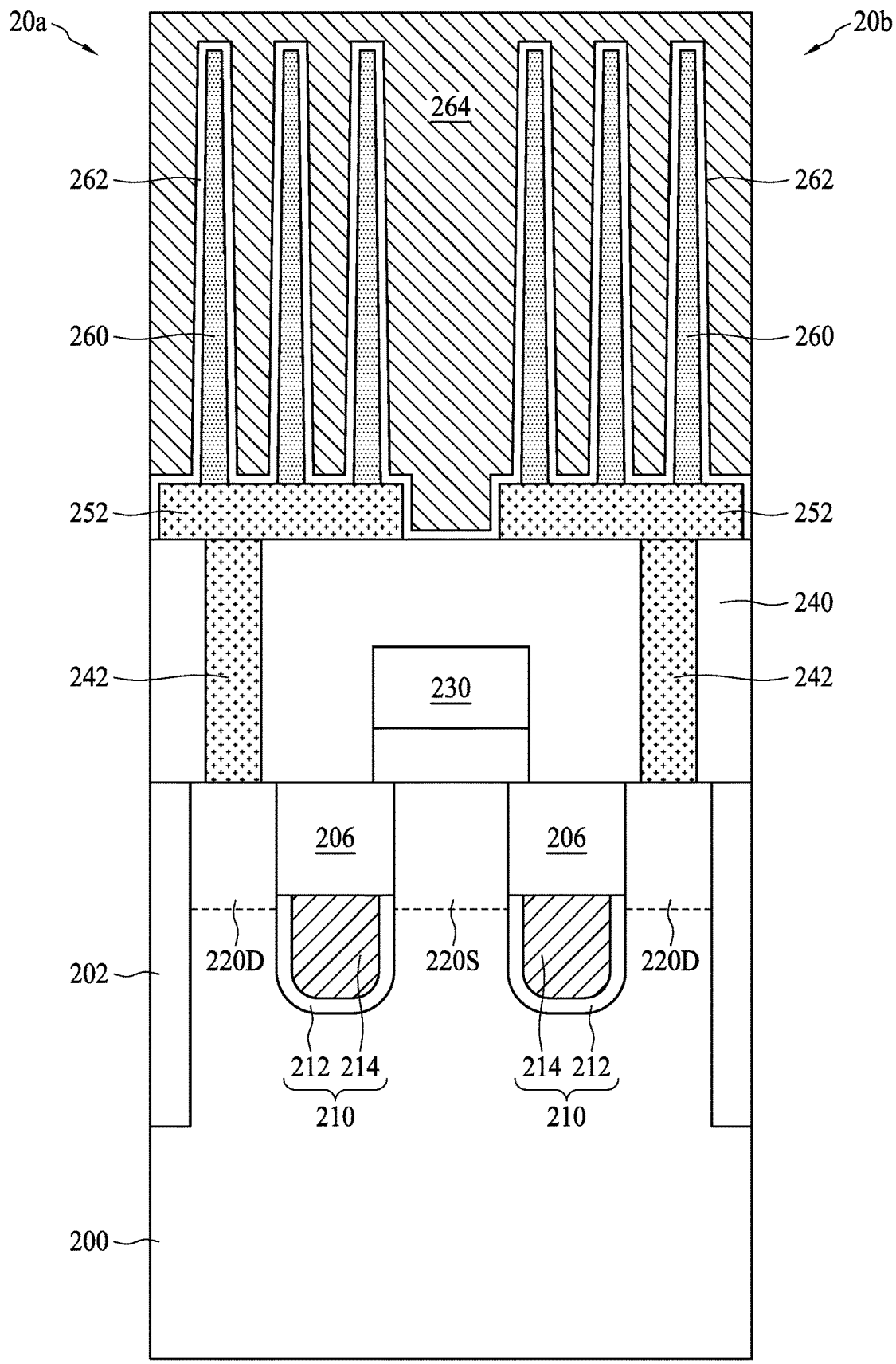
FIG. 6 is a schematic diagram illustrating a DRAM cell structure in accordance with some embodiments of the present disclosure.

Referring to FIG. 3E, a plurality of carbon nanotubes 260 are formed on the patterned conductive layer 252, that is, the landing pads 252, according to step 106 of the method 10. In some embodiments, the plurality of carbon nanotubes 260 can be formed by synthetic methods such as arc-discharge, laser ablation, gas-phase catalytic growth from carbon monoxide, and chemical vapor deposition (CVD) from hydrocarbons, but the disclosure is not limited thereto. The plurality of carbon nanotubes 260 can be vertically grown on the landing pads 252. Further, the plurality of carbon nanotubes 260 are formed separately from each other, as shown in FIG. 3E. In some embodiments, the plurality of carbon nanotubes 260 can be arranged to form an array, but the disclosure is not limited thereto. A length or a height of each of the carbon nanotubes 260 can be modified depending on different product requirements, and such details are omitted herein in the interest of brevity. In some embodiments, the modification of the length or height of the plurality of carbon nanotubes can be achieved by adjusting parameters of the CVD, but the disclosure is not limited thereto. Due to the material's exceptional strength and stiffness, the plurality of carbon nanotubes 260 can be constructed with a length-to-diameter ratio of up to 132,000,000:1. Further, the plurality of carbon nanotubes 260 can be formed on the landing pad 252 having a length or a width less than 10 nm, but the disclosure is not limited thereto. In some embodiments, the plurality of carbon nanotubes 260 on the same landing pad 252 can include different diameters along a lateral direction, which is perpendicular to the extending direction, as shown in FIG. 5, but the disclosure is not limited thereto. In some embodiments, the diameter of each carbon nanotube 260 is inconsistent along the extending direction, as shown in FIG. 6, but the disclosure is not limited thereto.

Figure 3F:
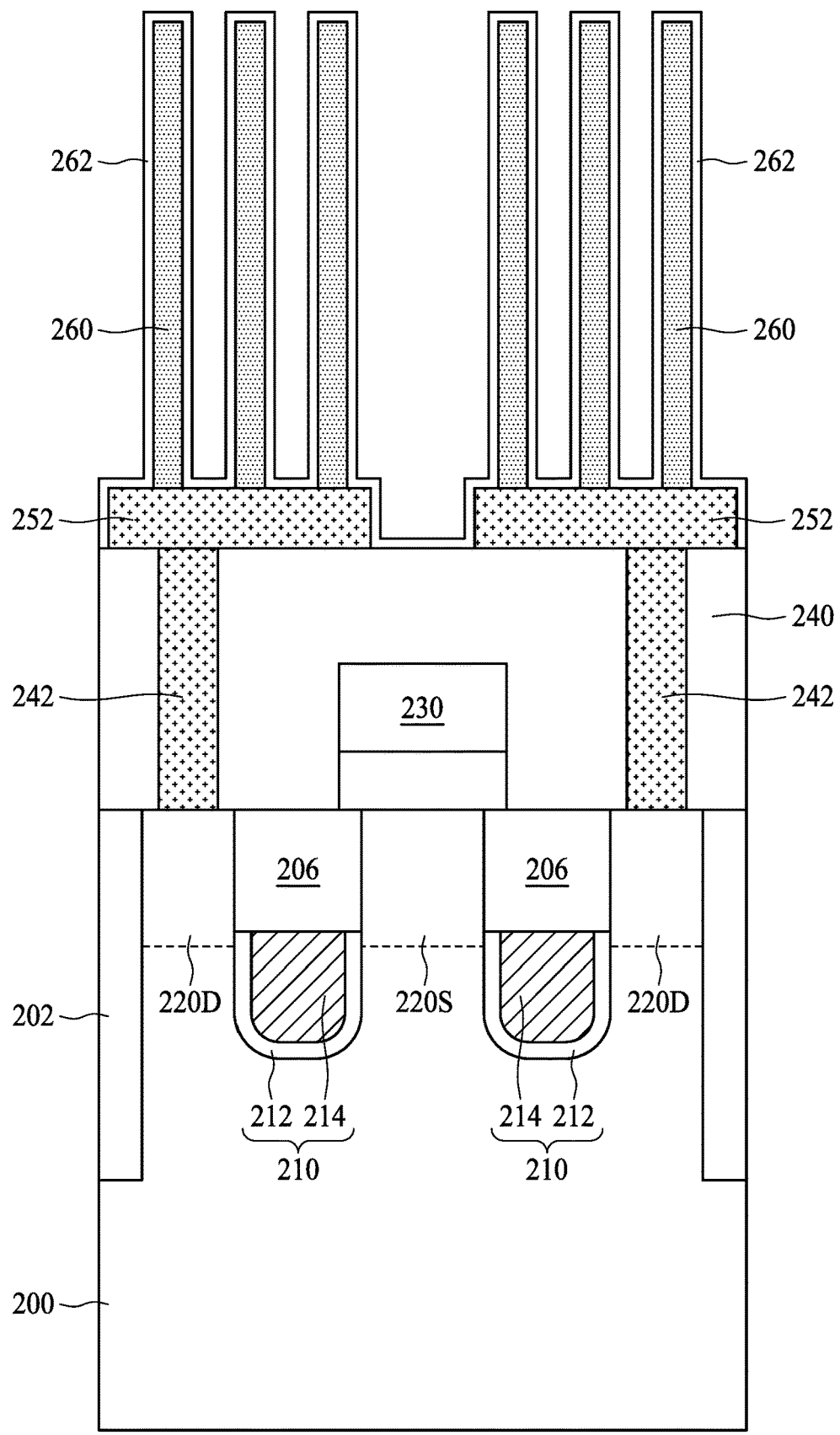

Referring to FIG. 3F, a dielectric layer 262 is next formed on the plurality of carbon nanotubes 260 and the landing pads 252 according to step 108 of the method 10. In some embodiments, a thickness of the dielectric layer 262 is between approximately 5 nm and approximately 20 nm, but the disclosure is not limited thereto. In some embodiments, the dielectric layer 262 can include oxide/silicon nitride/oxide (ONO) or high-k dielectric material such as $Ta_2O_5$, but the disclosure is not limited thereto. The dielectric layer 262 covers a top surface and sidewalls of each of the plurality of carbon nanotubes 260. Further, the dielectric layer 262 covers a portion of a top surface of the landing pads 252, which are exposed among the plurality of carbon nanotubes 260, and sidewalls of the landing pads 252, as shown in FIG. 3F.

Figure 3G:
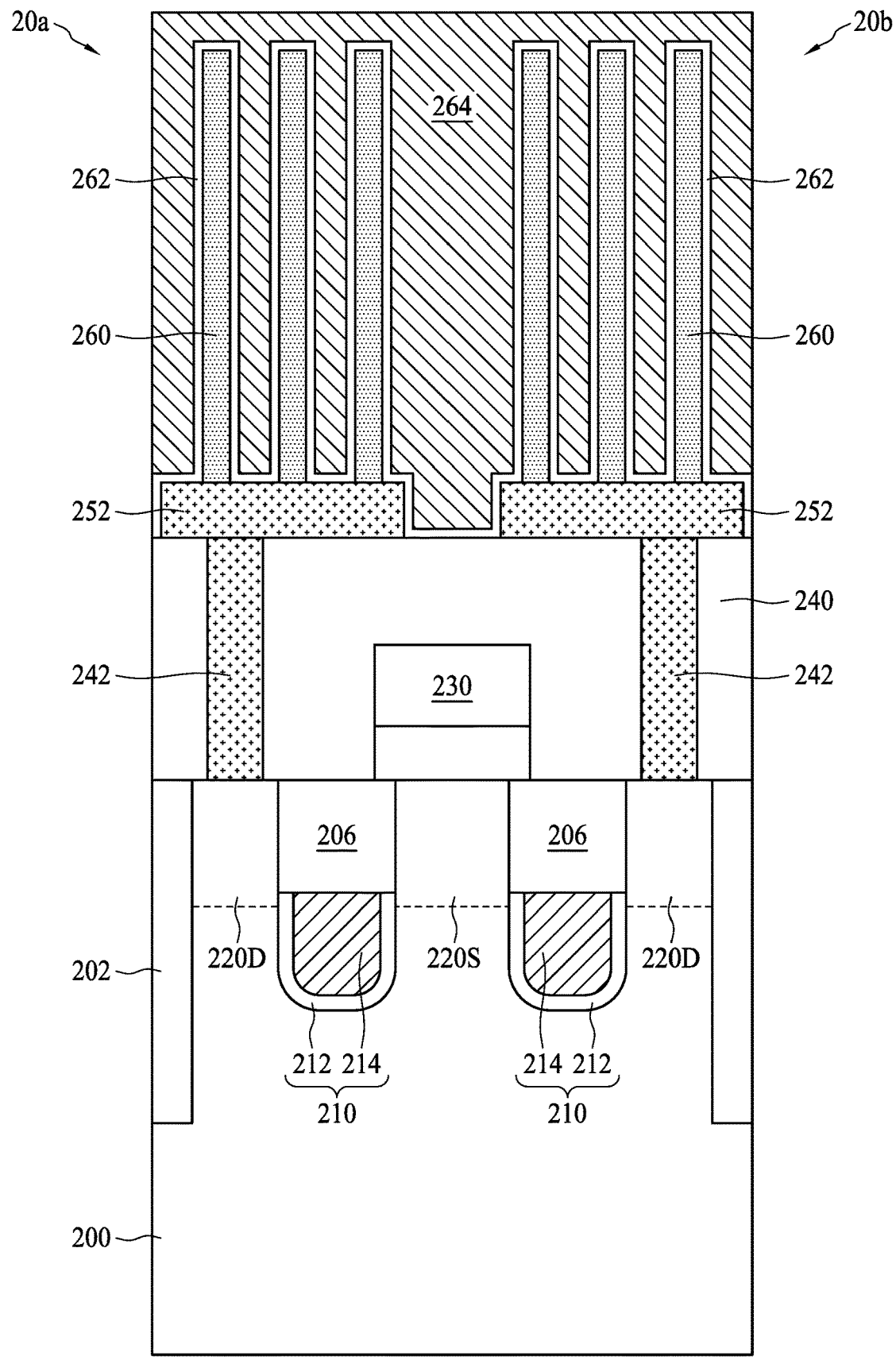

Referring to FIG. 3G, an electrode 264 is formed on the dielectric layer 262 according to step 110 of the method 10. It should be noted that the electrode 264 fills space between the plurality of carbon nanotubes 260. In some embodiments, the electrode 264 can be single-layered structure. In other embodiments, the electrode 264 can be a multiple-layered structure. The electrode 264 can include doped polysilicon, tungsten (W), tungsten silicide (WSi) or titanium nitride (TiN), but the disclosure is not limited thereto. In some embodiments, a thickness of the electrode 264 is between approximately 500 Å and approximately 2000 Å, but the disclosure is not limited thereto.

Accordingly, a DRAM cell structure 20a or a DRAM cell structure 20b is formed according to the method 10. The DRAM cell structures 20a and 20b respectively include the substrate 200, the gate structure 210 (i.e., the buried gate structure 210) disposed in the substrate 200, the source region 220S and the drain region 220D disposed in the substrate 200 at two sides of the buried gate structure 210, the bit line structure 230 disposed on the source region 220S, the landing pad 252 disposed over the drain region 220D, the contact plug 242 disposed on the drain region 220D for electrically connecting the landing pad 252 and the drain region 220D, the plurality of carbon nanotubes 260 disposed on the landing pad 252, the top electrode 264 disposed over the plurality of carbon nanotubes 260, and the dielectric layer 262 disposed between the plurality of carbon nanotubes 260 and the top electrode 264. Further, the DRAM cell structure 20a and the DRAM cell structure 20b include the dielectric structure 240. The dielectric structure 240 covers the bit line structure 230, and the contact plug 242 is formed within the dielectric structure 240. As shown in FIG. 3G, an extending direction of the plurality of carbon nanotubes 260 is substantially perpendicular to a surface of the substrate 200, but the disclosure is not limited thereto.

According to the DRAM cell structure 20a or 20b provided by the preferred embodiments, each carbon nanotube 260 has a diameter in nm scale. Therefore, the plurality of carbon nanotubes 260, which serve as a bottom electrode of a capacitor in a DRAM cell structure 20a or 20b due to their high conductivity (approximately $10^6$ S/cm), can be formed on the landing pad 252. Further, since each of the carbon nanotubes 260 has a very large surface area, capacitance of the capacitor is high.

Figure 4A:
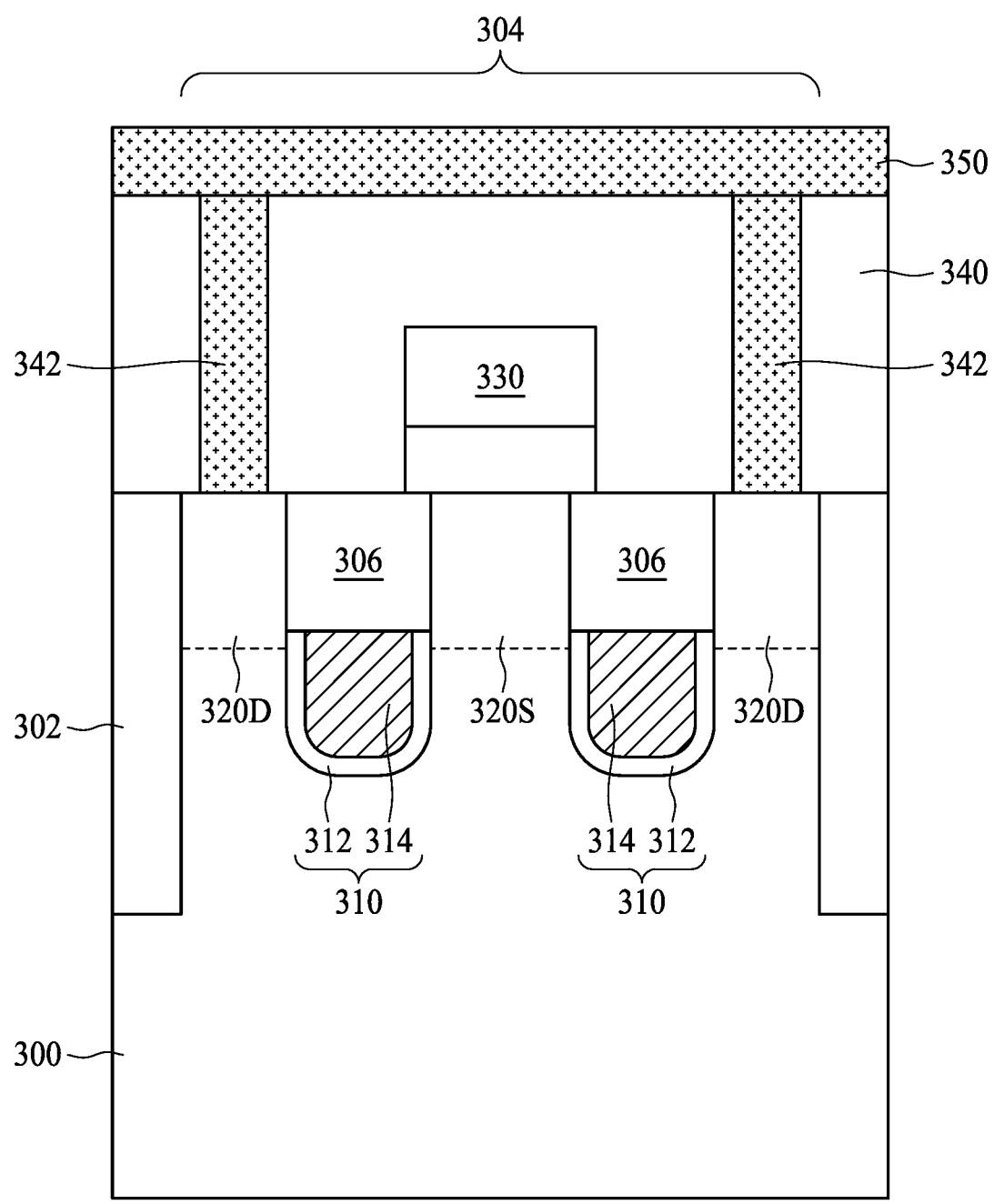
FIGS. 4A to 4E are schematic diagrams illustrating various fabrication stages of the method for preparing the DRAM cell structure in accordance with the second embodiment of the present disclosure.

FIGS. 4A to 4E are schematic diagrams illustrating various fabrication stages constructed according to the method for preparing the DRAM cell structure in accordance with the second embodiment of the present disclosure. It should be understood that similar features in the first and second embodiments can include similar materials, and thus such details are omitted in the interest of brevity. Referring to FIG. 4A, a substrate 300 is provided according to step 120 of the method 12. A well region (not shown) may be formed in the substrate 300. The well region may be neutral, or may be an n-type or p-type doped region, depending on the conductivity type of the transistor structure formed thereafter. An isolation structure 302, such as an STI structure, is formed in the substrate 300 for defining at least an active region 304.

Still referring to FIG. 4A, at least a gate structure 310 is subsequently disposed in the substrate 300 in the active region 304. In some embodiments, the gate structure 310 can be a buried gate structure, but the disclosure is not limited thereto. In some embodiments, two buried gate structures 310 can be formed in one active region 304, as shown in FIG. 4A, but the disclosure is not limited thereto. According to the embodiments, at least one trench (not shown) is formed in the substrate 300 by proper etchants. Next, a dielectric layer 312 covering sidewalls and a bottom of the trench is conformally formed in the trench. A conductive layer 314 is then formed on the dielectric layer 312 and recessed such that a top surface of the conductive layer 314 is lower than an opening of the trench. Next, an isolation structure 306 is formed to fill the trench, and a planarization process can be performed. Consequently, the buried gate structure 310, which serves as a buried word line for a DRAM device, is obtained. As shown in FIG. 4A, a top surface of the buried gate structure 310 is lower than a surface of the substrate 300 or lower than a top surface of the isolation structure 302.

Next, a source region 320S and a drain region 320D are formed in the active region 304 at two opposite sides of the gate structure 310. The source/drain region 320S/320D include an n-type or a p-type doped region, depending on the conductivity type of the transistor structure to be formed. In some embodiments, the source region 320S can be formed between the pair of buried gate structures 310, as shown in FIG. 4A. That is, the two buried gate structures 310 share one source region 320S. Accordingly, each buried gate structure 310 and the source/drain region 320S/320D adjacent thereto may constitute a MOSFET device, which serves as a cell selection element. Further, because the buried gate structure 310 may have a three-dimensional structure, a channel length of the channel region may be increased, and a short-channel effect may be reduced.

Still referring to FIG. 4A, a bit line structure 330 is formed on the source region 320S. In some embodiments, a contact plug (not shown) can be formed between the bit line structure 330 and the source region 320S. After the forming of the bit line structure 330, a dielectric structure 340 is formed on the substrate 300. As shown in FIG. 4A, the dielectric structure 340 covers the bit line structure 330 and the substrate 300. In some embodiments, the dielectric structure 340 can be a single-layered structure. In other embodiments, the dielectric structure 340 can be a multi-layered structure.

Still referring to FIG. 4A, a contact plug 342 is formed in the dielectric structure 340. Further, the contact plug 342 is formed on the drain region 320D for each MOSFET device. After the forming of the contact plugs 342, a conductive layer 350 is formed over the substrate 300 according to step 122 of the method 12. As shown in FIG. 4A, the conductive layer 350 is formed to completely cover the dielectric structure 240 and the contact plugs 342. Further, the conductive layer 350 is in contact with the contact plugs 342.

Figure 4B:
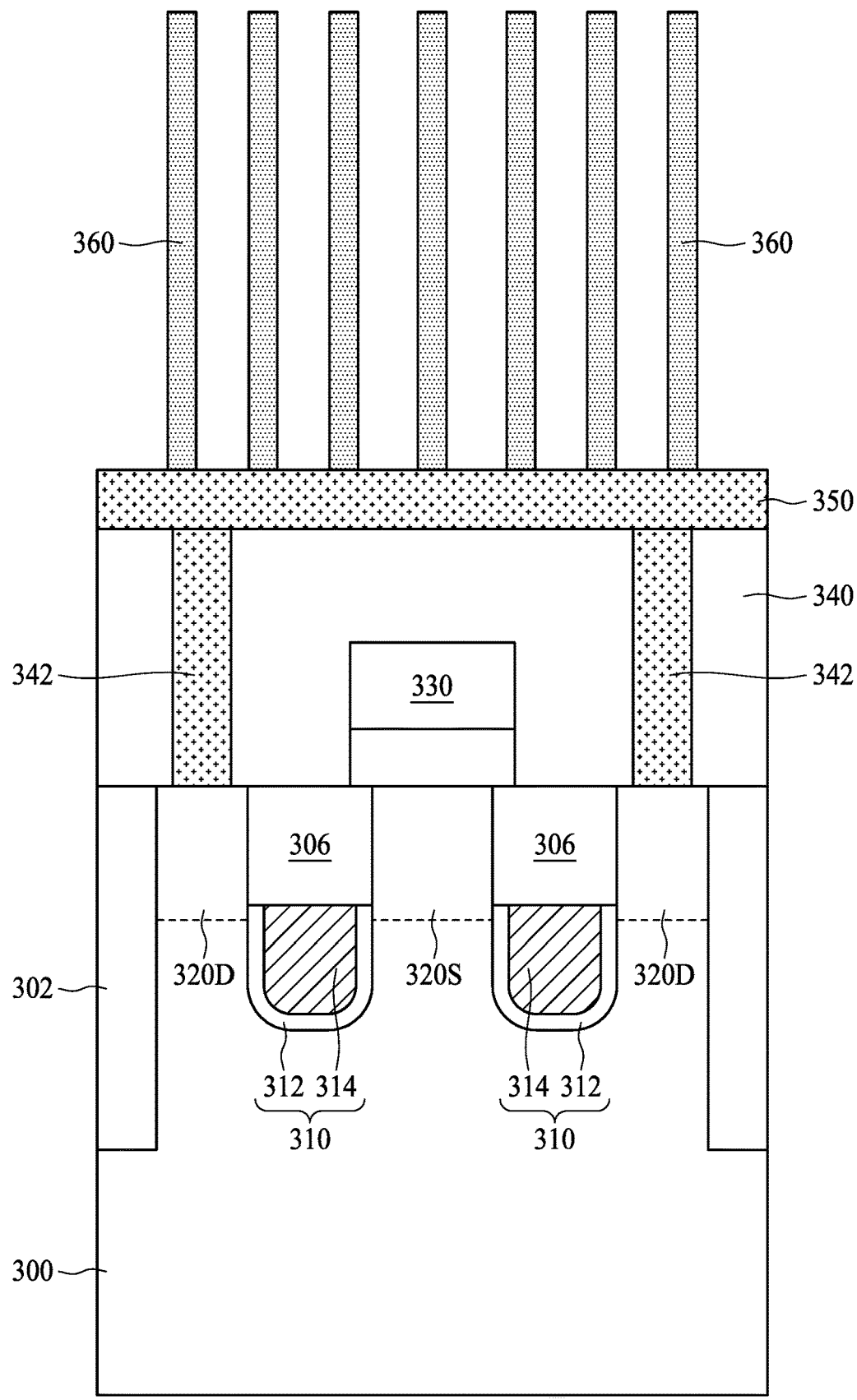

Referring to FIG. 4B, a plurality of carbon nanotubes 360 are formed on the conductive layer 350, according to step 124 of the method 12. In some embodiments, the plurality of carbon nanotubes 360 can be formed by synthetic methods such as arc-discharge, laser ablation, gas-phase catalytic growth from carbon monoxide, and CVD from hydrocarbons, but the disclosure is not limited thereto. The plurality of carbon nanotubes 360 can be vertically grown on the conductive layer 350. Further, the carbon nanotubes 360 are formed separately from each other, as shown in FIG. 4B. In some embodiments, the plurality of carbon nanotubes 360 can be arranged to form an array, but the disclosure is not limited thereto. As mentioned above, a length or a height of each of the carbon nanotubes 360 can be modified depending on different product requirements, and such details are omitted herein in the interest of brevity. In some embodiments, the modification of the length or height of the carbon nanotubes can be achieved by adjusting parameters of the CVD, but the disclosure is not limited thereto. Due to the material's exceptional strength and stiffness, the carbon nanotubes 360 can be constructed with a length-to-diameter ratio of up to 132,000,000:1.

Figure 4C:
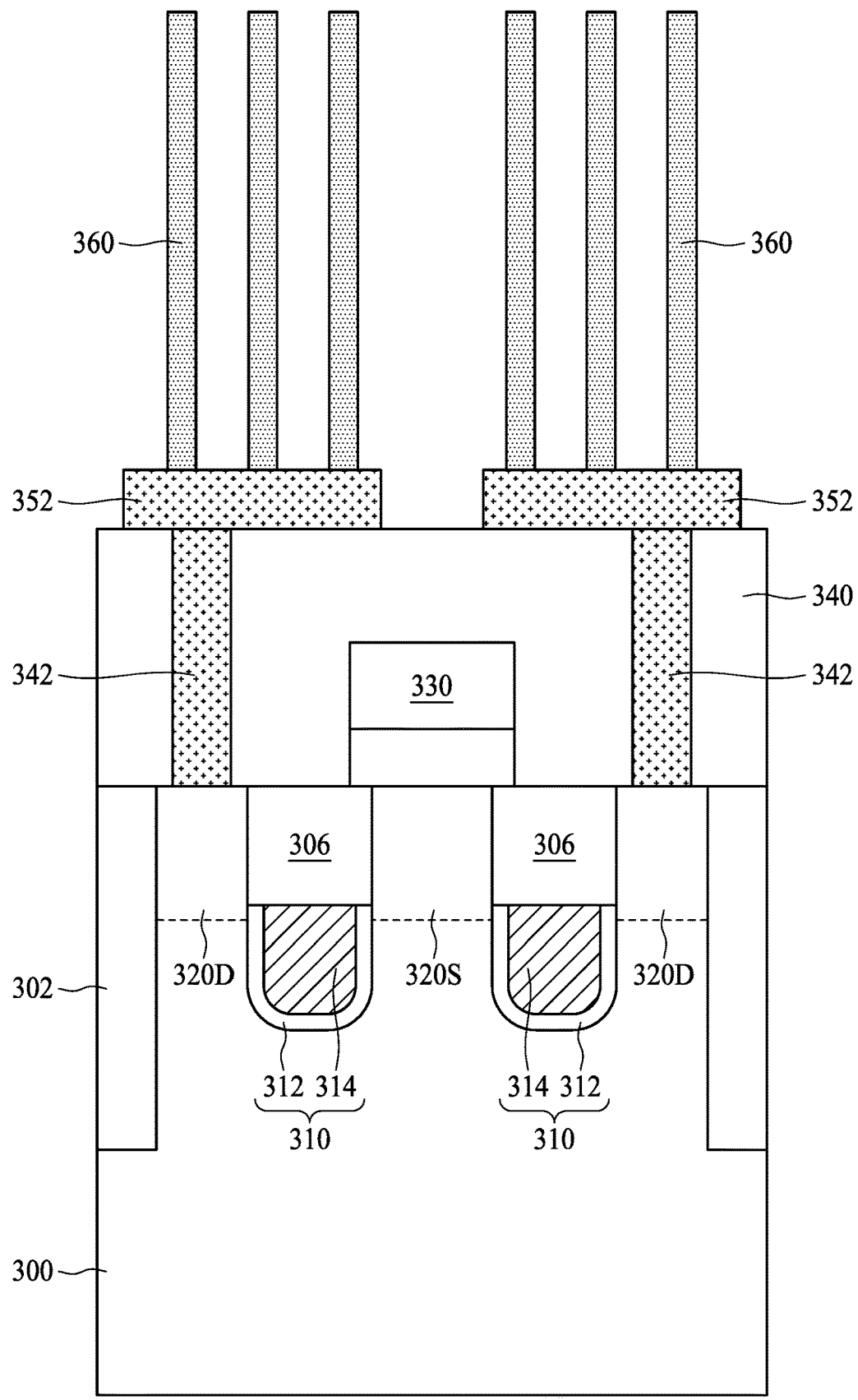

Referring to FIG. 4C, the conductive layer 350 is patterned according to step 126 of the method 12. The conductive layer 350 is patterned to form a landing pad 352 directly on each of the contact plugs 342, as shown in FIG. 4C. However, the landing pads 352 are physically and electrically insulated from each other. Further, the patterning of the conductive layer 350 removes several of the carbon nanotubes 360.

Figure 4D:
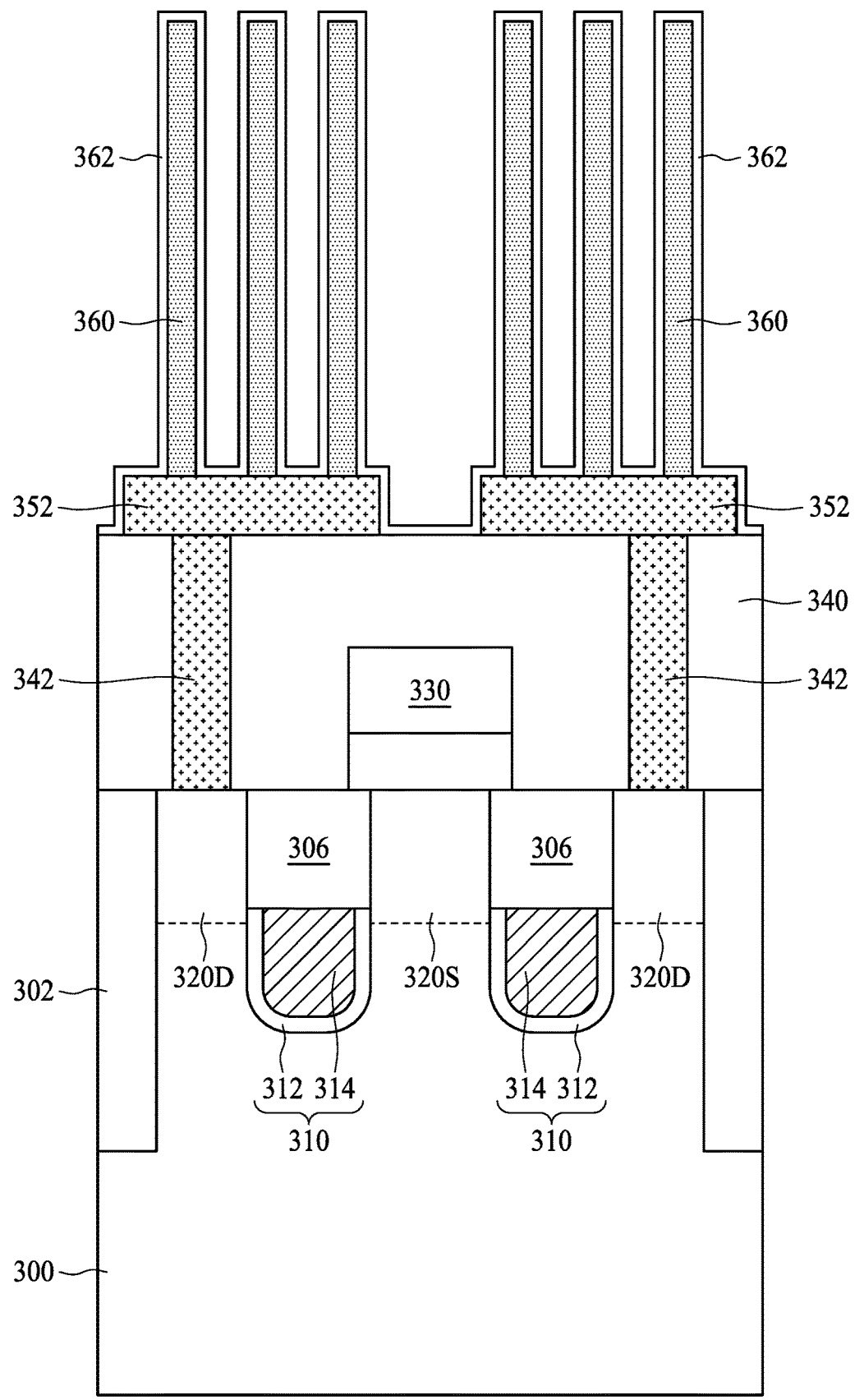

Referring to FIG. 4D, a dielectric layer 362 is next formed on the plurality of carbon nanotubes 360 and the landing pads 352 according to step 128 of the method 12. The dielectric layer 362 covers a top surface and sidewalls of each of the plurality of carbon nanotubes 360. Further, the dielectric layer 362 covers portions of a top surface of the landing pad 352, which are exposed among the plurality of carbon nanotubes 360, and sidewalls of the landing pads 352, as shown in FIG. 4D.

Figure 4E:
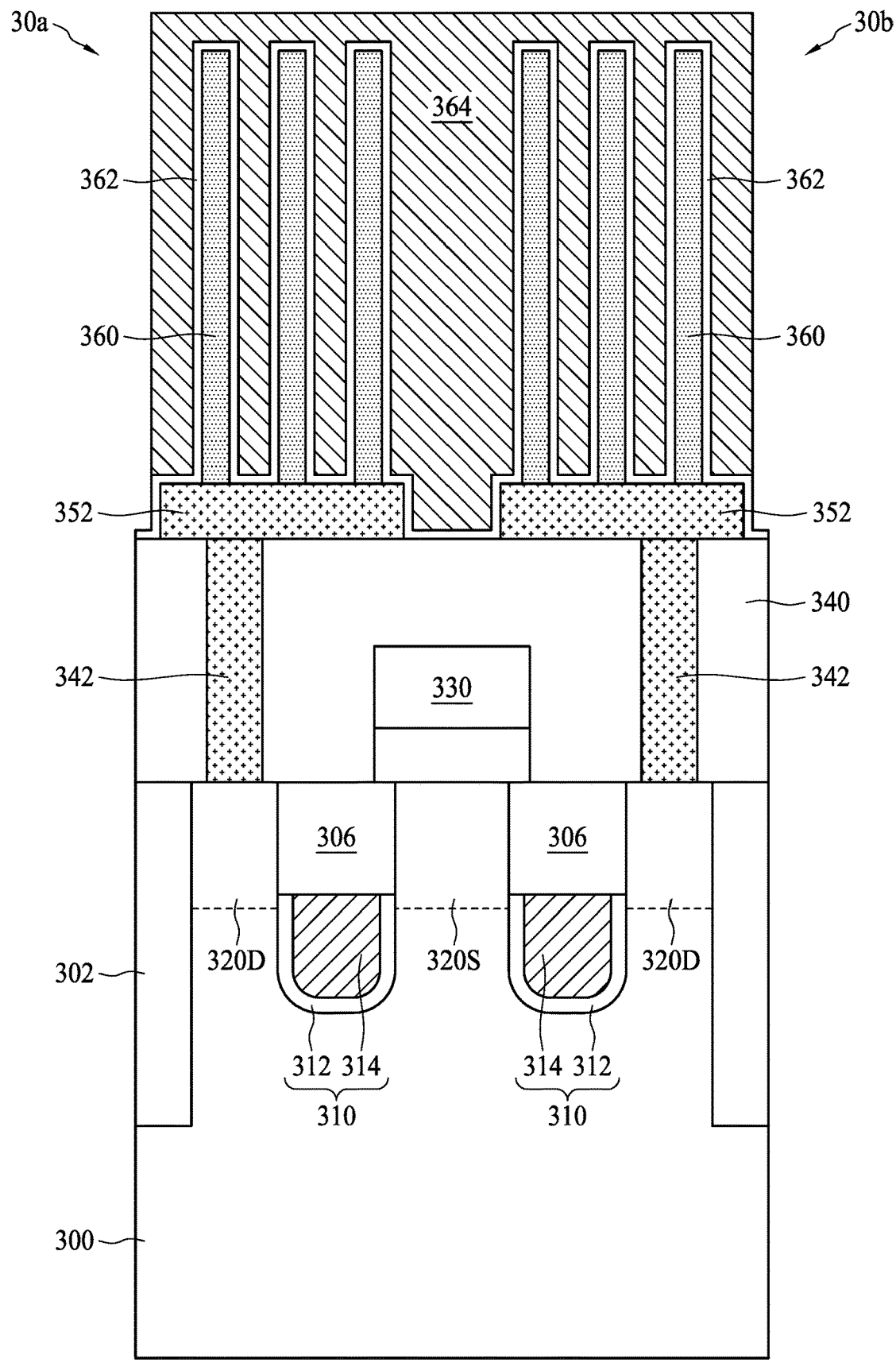

Referring to FIG. 4E, an electrode 364 is formed on the dielectric layer 362 according to step 130 of the method 12. It should be noted that the electrode 364 fills space between the plurality of carbon nanotubes 360.

Accordingly, a DRAM cell structure 30a or a DRAM cell structure 30b is formed according to the method 12. The DRAM cell structures 30a and 30b respectively include the substrate 300, the buried gate structure 310 disposed in the substrate 300, the source region 320S and the drain region 320D disposed in the substrate 300 at two sides of the buried gate structure 310, the bit line structure 330 disposed on the source region 320S, the landing pad 352, the contact plug 342 disposed on the drain region 320D for electrically connecting the landing pad 352 and the drain region 320D, the plurality of carbon nanotubes 360 disposed on the landing pad 352, the top electrode 364 disposed over the plurality of carbon nanotubes 360, and the dielectric layer 362 disposed between the plurality of carbon nanotubes 360 and the top electrode 364. Further, the DRAM cell structure 30a and the DRAM cell structure 30b include the dielectric structure 340. The dielectric structure 340 covers the bit line structure 330, and the contact plug 342 is formed within the dielectric structure 340. As shown in FIG. 4E, an extending direction of the plurality of carbon nanotubes 360 is substantially perpendicular to a surface of the substrate 300, but the disclosure is not limited thereto.

According to the DRAM cell structure 30a or 30b provided by the preferred embodiments, each carbon nanotube 360 has a diameter in nm scale. Therefore, the plurality of carbon nanotube 360, which is serve as a bottom electrode of a capacitor in a DRAM cell structure 30a or 30b due to their high conductivity (approximately $10^6$ S/cm), are formed on the conductive layer 350, and several carbon nanotubes 360 can be removed simultaneously with the patterning of the conductive layer 350. Accordingly, the plurality of carbon nanotubes 360 can be disposed on the landing pad 352. Further, since each of the carbon nanotubes 360 has a very large surface area, capacitance of the capacitor is high.

In the present disclosure, each carbon nanotube 260 and 360 has a diameter in nm scale, and it is therefore easy to form the plurality of carbon nanotubes 260 and 360 on the landing pads 252 and 352 or on the conductive layers 350, even when a width or a length of the landing pad 252 is less than 10 nm. Further, each carbon nanotube 260 and 360 has a large length-to-diameter ratio, which can be up to 132,000,000:1, and superior stiffness and strength even with such great length-to-diameter ratio. Therefore, each of the plurality of carbon nanotubes 260 and 360, which serve as a bottom electrode of a capacitor in a DRAM cell structure, has a very large surface area. Accordingly, capacitance of the capacitor is high. In addition, during the forming of the bottom electrode, the plurality of carbon nanotubes 260 and 360 can be grown vertically and be separated from each other without extra photolithography and etching processes, simplifying the manufacturing process, and improving both yield and reliability of the manufacturing process.

In contrast, with a comparative method applied without forming the plurality of carbon nanotubes, photolithography and etching processes are required to form at least one bottom electrode over the drain region. It is difficult to form such bottom electrode with such large length-to-diameter ratio, and thus formation of a thick conductive layer may be required, and followed by photolithography and etching processes described above. Such processes are complicated. Further, it is observed that a bottom electrode, even one with a length-to-diameter ratio less than that of the carbon nanotubes, may collapse. Accordingly, the conventional processes for forming DRAM cell structures are not only complicated, but also provide reduced yield and reliability.

One aspect of the present disclosure provides a DRAM cell structure. The DRAM cell structure includes a substrate, a gate structure disposed in the substrate, a source region and a drain region disposed in the substrate respectively at two sides of the gate structure, a landing pad disposed over the drain region, a plurality of carbon nanotubes disposed on the landing pad, a top electrode disposed over the plurality of carbon nanotubes, and a dielectric layer disposed between the top electrode and the plurality of carbon nanotubes.

Another aspect of the present disclosure provides a method for preparing a DRAM cell structure. The method includes the following steps. A substrate is provided. The substrate includes at least an active region, at least a gate structure disposed in the active region, and a source region and a drain region disposed in the active region at two sides of the gate structure. A conductive layer is formed over the substrate. A plurality of nanotubes are formed on the conductive layer. The conductive layer is patterned. A dielectric layer is formed to cover the plurality of carbon nanotubes and the conductive layer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A dynamic random access memory (DRAM) cell structure comprising:
    a substrate;
    a gate structure disposed in the substrate;
    a source region and a drain region disposed in the substrate respectively at two sides of the gate structure;
    a landing pad disposed over the drain region;
    a plurality of carbon nanotubes (CNTs) disposed on the landing pad, wherein the plurality of carbon nanotubes comprise different diameters;
    a top electrode disposed over the plurality of carbon nanotubes; and
    a dielectric layer disposed between the top electrode and the plurality of carbon nanotubes.

2. The DRAM cell structure of claim 1, further comprising a dielectric structure disposed on the substrate.

3. The DRAM cell structure of claim 2, further comprising a contact plug disposed in the dielectric structure, wherein the contact plug electrically connects the drain region and the landing pad.

4. The DRAM cell structure of claim 2, further comprising a bit line structure disposed on the source region, wherein the dielectric structure covers the bit line structure.

5. The DRAM cell structure of claim 1, wherein an extending direction of the plurality of carbon nanotubes is substantially perpendicular to a surface of the substrate.

6. A method for preparing a DRAM cell structure, comprising:
    providing a substrate comprising at least an active region, at least a gate structure disposed in the active region, and a source region and a drain region disposed in the active region at two sides of the gate structure;
    forming a conductive layer over the substrate;
    vertically growing a plurality of carbon nanotubes on the conductive layer, wherein the plurality of carbon nanotubes physically contact the conductive layer;
    patterning the conductive layer; and
    conformally forming a dielectric layer to cover the plurality of carbon nanotubes and the conductive layer;
    wherein the patterning of the conductive layer is performed before the forming of the plurality of carbon nanotubes;
    wherein the dielectric layer covers a top surface and sidewalls of each of the plurality of carbon nanotubes, portions of a top surface of the conductive layer, and sidewalls of the conductive layer.

7. The method of claim 6, wherein the patterning of the conductive layer further comprises removing several of the plurality of carbon nanotubes.

8. A method for preparing a DRAM cell structure, comprising:
    providing a substrate comprising at least an active region, at least a gate structure disposed in the active region, and a source region and a drain region disposed in the active region at two sides of the gate structure;
    forming a conductive layer over the substrate;
    vertically growing a plurality of carbon nanotubes on the conductive layer, wherein the plurality of carbon nanotubes physically contact the conductive layer;
    patterning the conductive layer; and
    conformally forming a dielectric layer to cover the plurality of carbon nanotubes and the conductive layer;
    wherein the patterning of the conductive layer is performed after the forming of the plurality of carbon nanotubes.

9. The method of claim 8, wherein the patterning of the conductive layer is performed before the forming of the dielectric layer.

10. The method of claim 9, wherein the dielectric layer covers a top surface and sidewalls of each of the plurality of carbon nanotubes, portions of a top surface of the conductive layer, and sidewalls of the conductive layer.

11. The method of claim 8, further comprising forming an electrode on the dielectric layer.

12. The method of claim 8, further comprising forming a dielectric structure over the substrate.

13. The method of claim 12, further comprising forming a contact plug in the dielectric structure, wherein the contact plug electrically connects the drain region and the conductive layer.

14. The method of claim 12, further comprising forming a bit line structure on the source region before the forming of the dielectric structure.

15. The method of claim 8, wherein an extending direction of the plurality of carbon nanotubes is perpendicular to a surface of the substrate.

* * * * *